United States Patent
Wilson

(10) Patent No.: US 8,009,491 B2
(45) Date of Patent: Aug. 30, 2011

(54) MEMORY ACCESS STROBE CONFIGURATION SYSTEM AND PROCESS

(75) Inventor: Christopher Wilson, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/614,019

(22) Filed: Nov. 6, 2009

(65) Prior Publication Data

US 2010/0054056 A1 Mar. 4, 2010

Related U.S. Application Data

(62) Division of application No. 11/586,057, filed on Oct. 25, 2006, now Pat. No. 7,715,251.

(51) Int. Cl.
*G11C 7/00* (2006.01)

(52) U.S. Cl. ........................................ 365/193; 365/236
(58) Field of Classification Search .................. 365/193, 365/236
See application file for complete search history.

(56) References Cited

U.S. PATENT DOCUMENTS

| | | | | |
|---|---|---|---|---|
| 2007/0096762 A1* | 5/2007 | Yamane et al. | ............... | 324/765 |
| 2007/0217559 A1* | 9/2007 | Stott et al. | ..................... | 375/355 |

* cited by examiner

*Primary Examiner* — Hoai V Ho

(57) ABSTRACT

A memory access strobe configuration system and process operable to generate a strobe signal having a selected phase. Based on the strobe signal, a write/read cycle using a first logic value at a memory location of a memory device generates a result logic value. The result logic value provided by the write/read cycle is compared to the first logic value. Where there is a mismatch between the result logic value and the first logic value, the phase of the strobe signal is updated. The process is then repeated using a strobe signal having the updated phase.

18 Claims, 6 Drawing Sheets

MEMORY ACCESS STROBE CONFIGURATION SYSTEM AND PROCESS

RELATED APPLICATIONS

This is a divisional of application Ser. No. 11/586,057, filed Oct. 25, 2006, now U.S. Pat. No. 7,715,251.

BACKGROUND

In computer memory systems it is important to minimize the time necessary to read data from a memory, such as a random access memory (RAM), for example. When using a RAM array with self-contained read amplifier strobe timing, current methods use a conservative timing estimate obtained from circuit simulation. Since it is a conservative estimate, the timing is slower than what ideally could be used. Another method is to measure the RAM performance and set the timing once, usually based on setting a number of fuses appropriately. Such an approach addresses process variations, but once the timing is set, the RAM array does not have the ability to dynamically alter its timing as needed to respond to environmental variations such as, e.g., variations in voltage, temperature or noise.

DETAILED DESCRIPTION OF THE DRAWINGS

Figure 1:
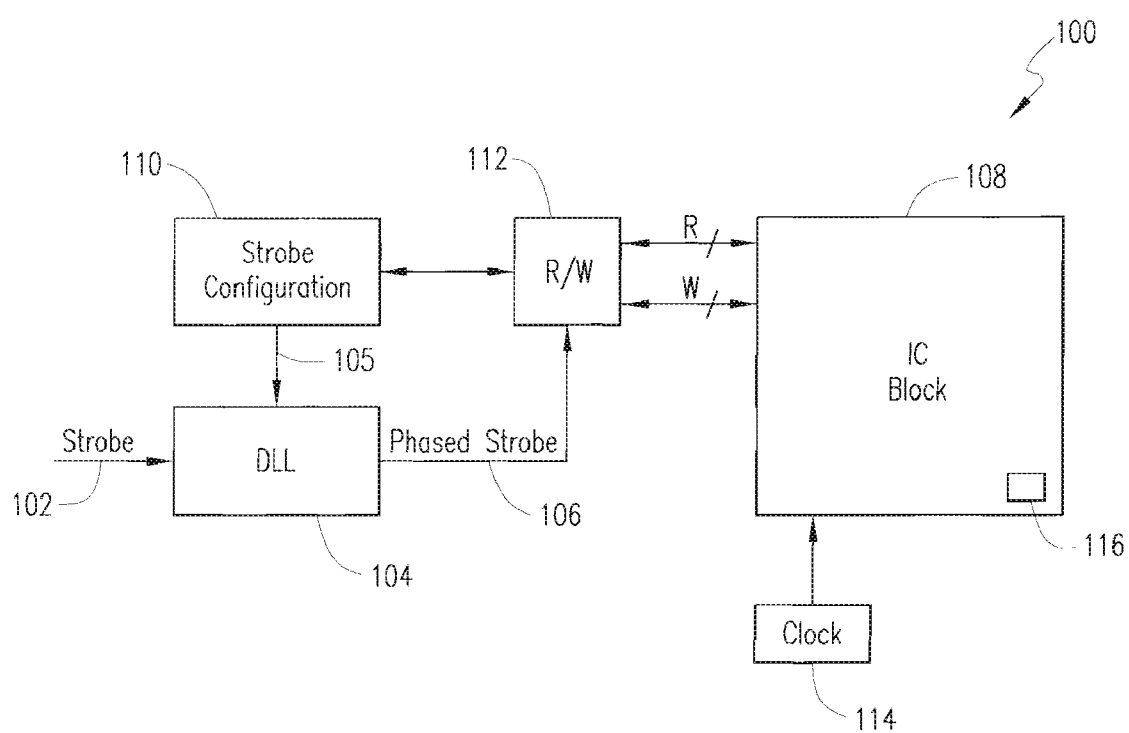
FIG. 1 illustrates an exemplary dynamically configurable strobe system in accordance with an embodiment.

Representative embodiments of the present patent disclosure will now be described with reference to various examples wherein like reference numerals are used throughout the description and several views of the drawings to indicate like or corresponding parts, and further wherein the various elements are not necessarily drawn to scale.

With reference to FIG. 1, a feedback configured strobe memory system diagram 100 is shown according to one embodiment. A timing signal 102, typically a clock signal or any appropriate signal subject to phase shifting, may be received by a phasing element such as a delay-locked loop (DLL) circuit 104. The DLL module 104 may respond to the clock signal 102 (which may be derived from another clock, such as a global clock, e.g., clock 114) and a provided phase control signal 105 to generate a phased strobe signal 106 such that the phase of the phased strobe signal 106 is offset by a selected phase from a reference signal such as timing signal 102. The phased strobe signal 106 is received by a read/write (R/W) block for facilitating access operations with respect to IC block 108. In one implementation, the IC block may be a memory such as a static random access memory (SRAM) or any other suitable addressable digital device.

A static random access memory may be implemented typically as a semiconductor retaining memory contents where power may be continuously applied, typically without refresh cycles. Storage cells storing bits within an SRAM device may be implemented as four transistors forming two cross-coupled inverters. The storage cells have two stable states, designating a logic one or a logic zero. Two access transistors may serve to control access to the storage cell during read and write operations.

Access to the data stored in each storage cell is enabled by a word line, controlling access transistor states. The access transistors control connection of a storage cell to a bitline. In a typical SRAM, a bitline and an inverse bitline are provided to enhance noise margins and to permit differential voltage measures. When data is read from a cell in the memory array, the cell begins to pull the voltage of one of two bitlines toward ground (GND) depending on the value of the data read. The SRAM cell may be very small and typically has modest drive strength compared to the relatively larger load of the bitlines. As a result, the rate of change of the voltage between the bitlines may be very low. A strobe signal is used to indicate timing to a sense amp, so that it senses the polarity of the bitlines when the voltage differential is sufficient to indicate the correct data.

SRAM devices typically allow higher speeds with synchronous addressing, where the entire address is provided to the memory device during a single clock cycle. During read access, the bitlines of a static random access memory may be typically actively driven high and low respectively by inverters in a storage cell, an arrangement that permits high-speed data access. Such an arrangement allows for differential signaling that facilitates detection of small voltage swings. The margin of detection of the sense amp requires the timing of strobe to be sufficiently long to permit accurate detection while efficiency requires the timing of the strobe be minimized.

A strobe configuration module 110 provides phase delay control signal 105 to the DLL module 104 to select the phase delay of the phased strobe signal 106. The strobe configuration module 110 is operable responsive to control signals provided by R/W module 112, illustrated in FIG. 1 as a simplified representation of appropriate read/write circuitry, row/column address circuitry, sense amp circuitry, etc. associated with SRAM 108, which serves as an interface with respect to memory data access. In general, R/W module 112 may accommodate both read operations and write operations without regard to order. A write/read cycle may comprise writing a bit to a selected memory location and then reading the bit stored in the selected memory location.

The main component of DLL 104 is a delay chain composed of a plurality of delay gates connected in series. The input of the chain is connected to the clock that is to be delayed. In one implementation, a multiplexer may be connected to each stage of the delay chain, wherein a suitable selector signal may be employed to effect the delay.

Accordingly, it should be seen that the delay of a delay line may be controlled by a control signal applied to a control input of the delay line. In practice, there may normally be some delay between an externally accessible input terminal receiving a timing signal and an input to the delay line. Similarly, there is normally some delay between an output of a delay line and the input to a latch as well as between a output of a latch and an externally accessible data bus terminal. A circuit modeling these delays may then be inserted in a feedback path between an output of a delay line and an input of a phase detector.

A variety of designs for delay lines may be used in accordance with the teachings herein. In one delay line design, the timing signal may propagate through a large number of delay elements, such as inverters, that may be coupled in series with each other as alluded to previously. The particular delay element to which a timing signal is applied and/or the timing output signal is taken is adjusted by a control signal to vary the number of delay elements through which the timing signal propagates.

The phase detector may generate an error signal having a magnitude that is proportional to the difference between the phase of the timing signal and the phase of the timing output signal. The error signal controls the delay with which the timing signal is coupled to a delay line. Thus, the error signal may control the phase of the timing signal relative to the phase of the timing output signal.

In operation, the error signal adjusts the delay of the delay line to minimize the magnitude of the error signal. If the output timing signal leads the timing signal, a phase detector may generate an error signal having a polarity that increases the delay of a delay line to reduce the difference between the phase of the timing output signal and the phase of the timing signal. Conversely, if the timing output signal lags the timing signal, a phase detector generates an error signal having a polarity that decreases the delay of the delay line to reduce the difference between the phase of the timing output signal and the phase of the timing signal. As long as the loop gain of the delay_lock loop is high, the rising and falling edges of the timing signal will substantially coincide with the rising and falling edges of the timing output signal.

Based on the foregoing discussion, those skilled in the art will recognize that a DLL containing several delay lines can be used to generate multiple phases of a clock signal that is operable as a sense amp strobe signal with respect to memory access operations, as will be described in detail hereinbelow. As set forth above, the DLL may include a phase detector having a first input receiving the timing signal and a second input receiving the timing output signal from the output of the delay_locked loop, wherein the phase detector produces an error signal having a magnitude and polarity corresponding to the difference between the phase of the timing signal and the phase of the timing output signal.

The error signal may be coupled, for example, to respective control inputs of a plurality of delay lines each of which includes the same number and type of delay elements so that they each produce the same delay. Where four delay lines are implemented, for example, the timing output signal at the output of the last delay line may be locked to the timing signal, whereby a phase of 360 degrees relative to the phase of the timing signal may be obtained. As a result, the signal at the output of the first delay line has a phase of 90 degrees, the signal at the output of the second delay line has a phase of 180 degrees, and the signal at the output of the third delay line has a phase of 270 degrees. It will be understood that a greater or lesser number of phases can be generated by using a greater or lesser number of delay lines in a particular DLL arrangement.

In accordance with an embodiment, R/W module 112 initiates a write/read cycle using a first logic value, such as a logic one, with respect to any location in SRAM 108. Further, the R/W module 112 may initiate a write/read cycle using a second logic value, such as a logic zero, at the same location in the memory. As alluded to previously, in the context of the present patent disclosure, a write/read cycle comprises writing a logic value to a particular memory location and reading the value from that location. As illustrated in FIG. 1, the write/read cycle may use a selected memory location 116 for feedback, where the selected memory location may be selected with regard to certain topological constraints, e.g., the distance from the interface 112 determined in terms of time-of-travel signal distance.

The write/read cycles are operable to provide feedback measurements with respect to the suitability of the selected phased strobe delays. If the write/read cycles retrieve the same logic value as the one written, the strobe delay as selected may be used as the strobe signal 106 for accessing the memory 108. If either of the write/read cycles retrieves an incorrect logic value, where the logic values do not match, a control signal may be provided to the strobe configuration module 110 which in turn may update the phase delay of the DLL module appropriately. For example, where a logic zero is written to the memory location 116 and a logic one is retrieved when the memory location 116 is read, there is a mismatch detected. Accordingly, an appropriate delay control signal 105 is provided by the strobe configuration module 110 to DLL 104.

Figure 2:
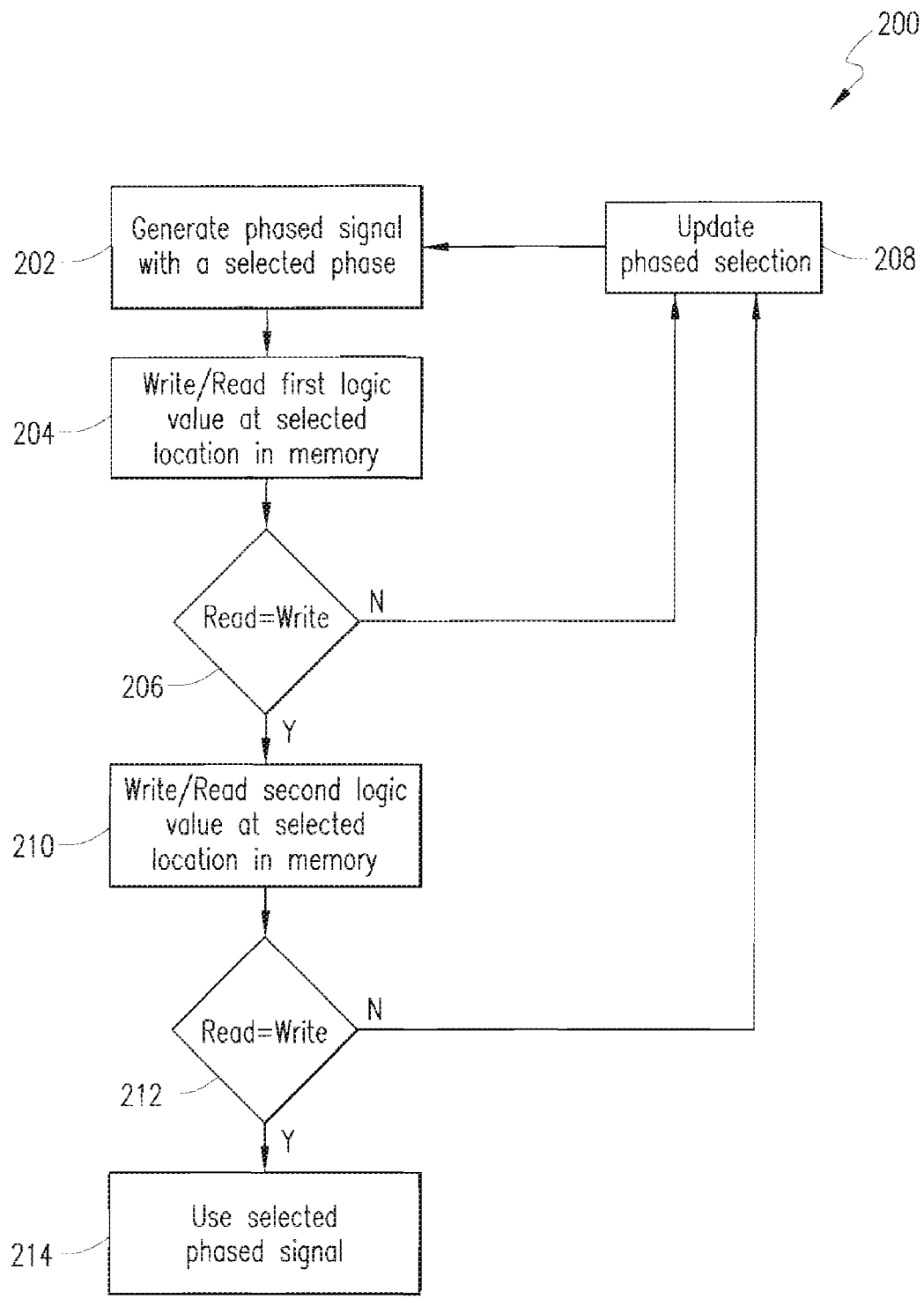
FIG. 2 illustrates an exemplary strobe configuration process according to one embodiment.

Referring to FIG. 2, an embodiment of a dynamic strobe phasing process 200 is shown. A phased signal having a selected phase is generated at function block 202. Pursuant to a first write/read cycle, a first logic value is written to a selected memory location and a read logic value (i.e., a first result logic value) is read from the selected memory location at function block 204. At decision block 206, the read logic value is compared to the first logic value. If the read logic value does not match the first logic value (i.e., a mismatch is detected), the process continues along the NO path to function block 208 where the phase selection is updated. If the read logic value matches the first logic value, the process continues along the YES path to function block 210 where a second write/read cycle may be effectuated. A second logic value is written to a selected memory location and a read logic value (i.e., a second result logic value) is read from the selected memory location at function block 210.

At decision block 212, the second result logic value is compared to the second logic value. If the read logic value does not match the second logic value, the process continues along to the NO path to function block 208 where the phase selection is updated. Thereafter, a new phased signal is generated using the updated phase selection at function block 202. On the other hand, if the read logic value matches the second logic value at block 212, the process continues along the YES path to function block 214 where the selected phased signal is provided to the memory circuit as a phased strobe signal.

Based on the foregoing description, one skilled in the art will recognize that an embodiment of a memory access strobe configuration process may comprise the following operations: a generating a strobe signal having a selected phase; based on the strobe signal, effectuating a first write/read cycle of a first logic value at a memory location of a memory to generate a first result logic value; and if there is a mismatch between the first result logic value provided by the first write/read cycle and the first logic value, updating the selected phase of the strobe signal and repeating the effectuating based on the strobe signal having the updated phase. Optionally, in a further variation, the process may comprise additional steps as follows: effectuating a second write/read cycle of a second logic value at the memory location to generate a second result logic value; and if there is a mismatch between the second result logic value provided by the second write/read cycle and the second logic value, updating the selected phase of the strobe signal and repeating the effectuating of the write/read cycle(s) based on the strobe signal having the updated phase. In a still further embodiment, both first and second write/read cycles may be required such that only when both reads come back with correct values, calibration or tuning of the phase delay may be deemed to be completed.

Figure 3:
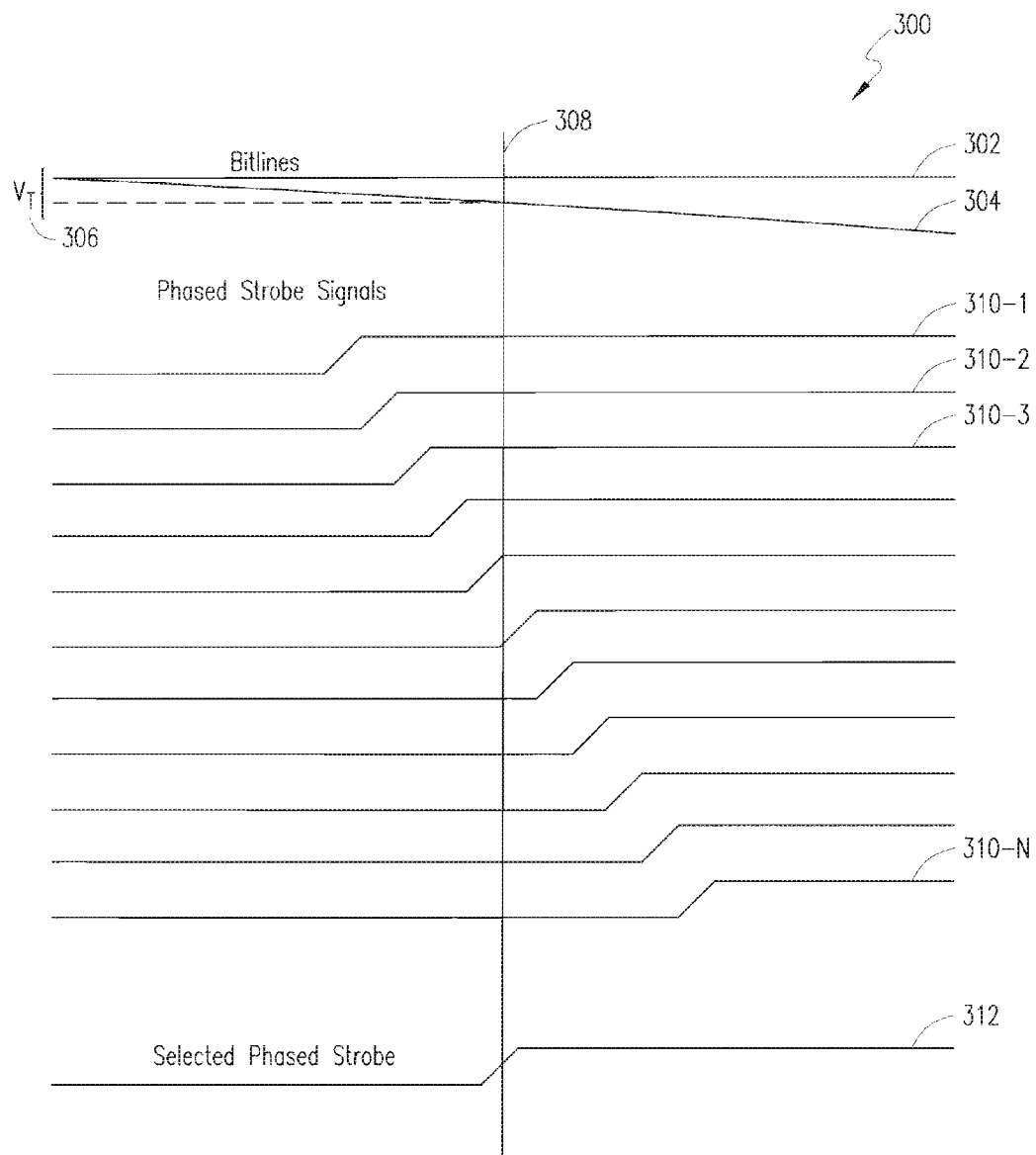
FIG. 3 illustrates timing diagrams related to an exemplary strobe configuration process.

Referring to FIG. 3, an exemplary timing diagram 300 is shown. The output of a memory storage cell may be represented by the signals on two bitlines 302 and 304. During a read operation, the voltage difference between bitline 302 and 304 diverges such that a threshold voltage $V_T$ 306 is achieved at a determined time 308, which is the minimum level of separation needed for accurately sensing a data value by the sense amp.

A phase shift circuit such as a DLL provides a sequence of strobe signals 310-1 to 310-N, where each strobe signal provided is shifted in phase from the other strobe signals. A particular one of the strobe signals may be selected based on the strobe phase configuration process described above in reference to FIG. 2, wherein the selected strobe signal is operable with an optimal phase delay (e.g., with the shortest delay) that will provide accurate data storage and retrieval. By way of illustration, a selected phased strobe signal 312 is provided to the sense amps of the SRAM storage cells since its triggering (i.e., rising edge) matches the minimum bitline separation of $V_T$ 306.

Figure 4:
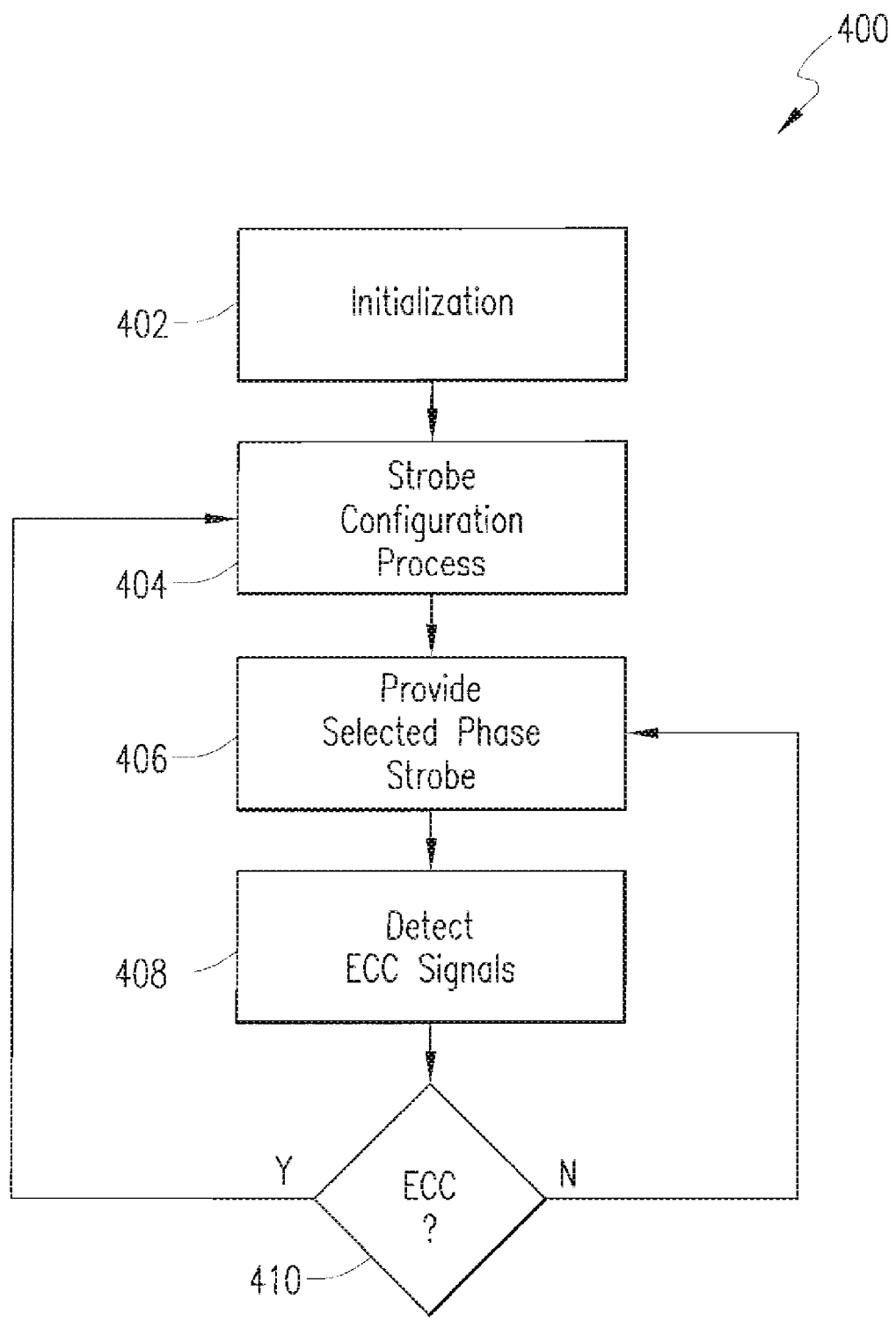
FIG. 4 illustrates an embodiment of a strobe configuration process.

With reference to FIG. 4, an embodiment of a scheme 400 is provided for configuring memory strobe phase in response to error signals. Typically, when a memory is initialized at function block 402, a strobe phase configuration process 404 is invoked. As a result, a selected phased strobe signal is provided to the memory device at function block 406. During operation of the memory, error signals such as error correction codes (ECC) may be detected at function block 408. If an error correction code is detected at decision block 410, the process continues along the YES path to repeat the strobe configuration/reconfiguration process (i.e., calibration) at function block 404, whereby the same phase or a new phase may be selected for the strobe signal provided by the DLL. If no error signal is detected at decision block 410, the process continues along the NO path to continue providing the selected phased strobe at function block 406.

Figure 5:
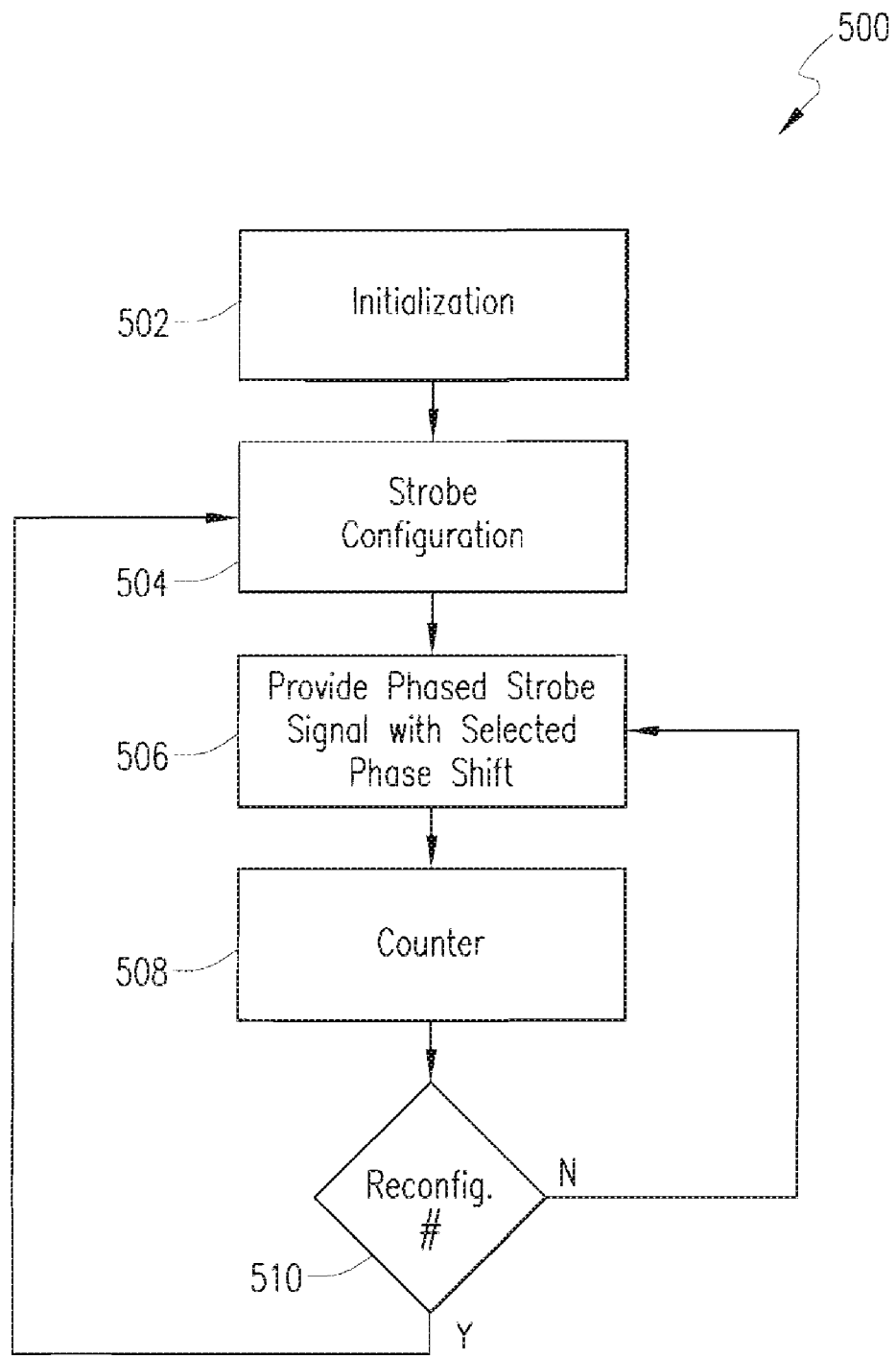
FIG. 5 illustrates another embodiment of a strobe configuration process.

With reference to FIG. 5, an embodiment of a scheme 500 is provided for configuring memory strobe phase after a predetermined time period has elapsed since initialization of a memory device. Typically, when the memory is initialized at function block 502, a strobe phase configuration process 504 is invoked and a selected phased strobe signal is accordingly provided to the memory device (block 506). During operation of the memory, a counter is incremented (block 508) for a determined number of counts. When the counter reaches the determined reconfiguration number at decision block 510, the process continues along the YES path to repeat the strobe configuration process at function block 504, wherein the same or a new phase may be selected for the DLL's strobe signal. Until the reconfiguration number is detected at decision block 510, the process continues along the NO path to continue providing the selected phased strobe at function block 506.

The strobe calibration process may be performed more or less often, depending on the variability of the processing environment, including drift in operational temperatures and voltages. The strobe calibration process may be enabled for fully-automatic configuration and reconfiguration without any operator intervention.

Figure 6:
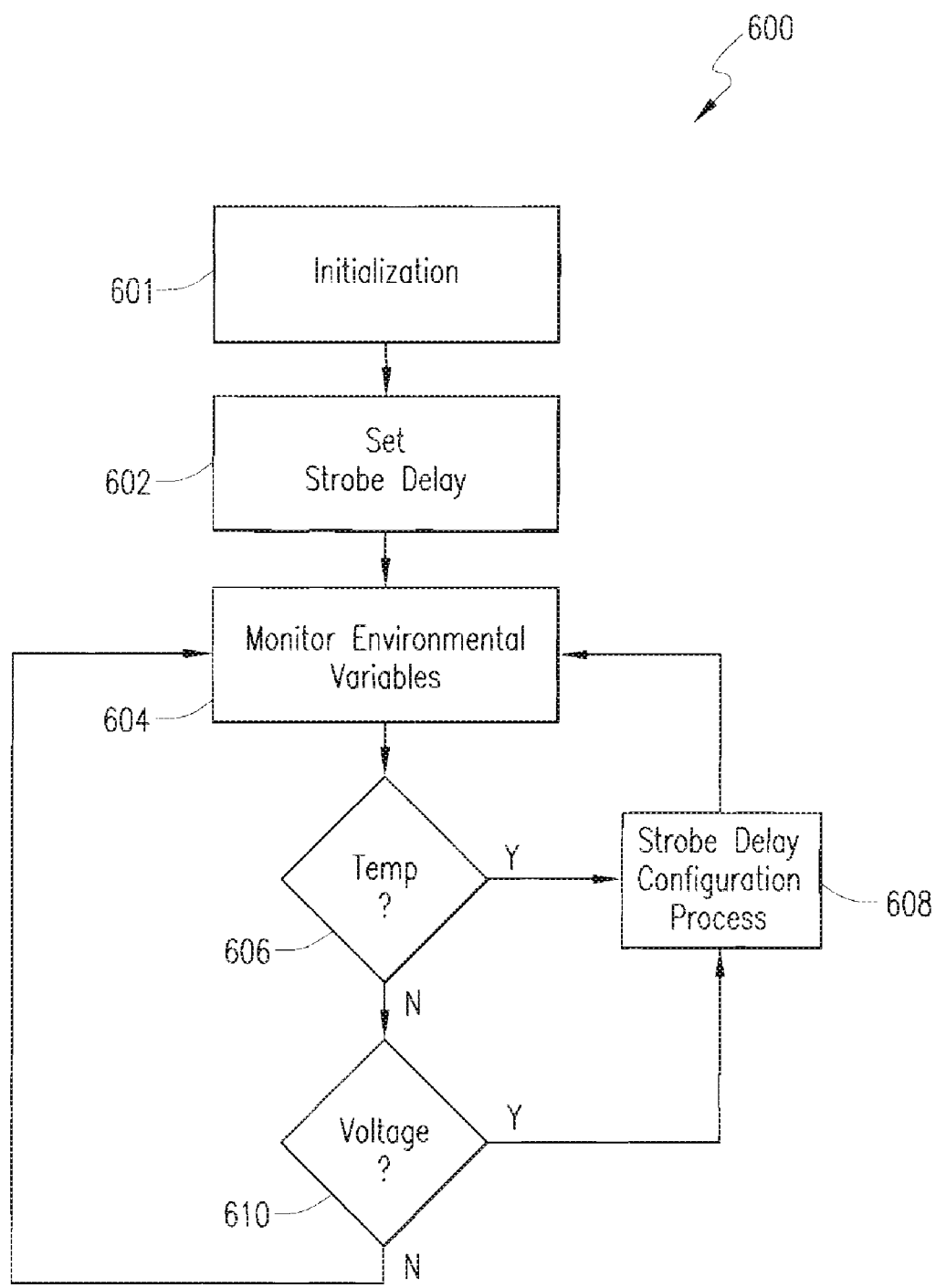
FIG. 6 illustrates yet another embodiment of a strobe configuration process.

With reference to FIG. 6, an embodiment of a strobe configuration process 600 is shown wherein a strobe signal's phase may be calibrated based on certain environmental variables. Upon initialization of a memory (block 601), a select strobe delay is set at function block 602. The delay may be set by an initialization routine or any other strobe configuration process. As the memory is in operation, environmental monitoring is performed at function block 604. For example, the temperature and voltages experienced by the memory may be monitored.

Periodically or at random intervals, one or more environmental variables may be tested against predetermined threshold values or setpoints. A first environmental variable (e.g., the temperature) is tested at decision block 606. If the temperature matches or exceeds a predefined temperature threshold, the process follows the YES path to function block 608 wherein a strobe configuration/reconfiguration process is executed to appropriately calibrate the phase delay. The process then returns to function block 604 to proceed with environmental variable monitoring.

Where a first environmental variable (i.e., the measured temperature) does not satisfy a predetermined criterion at decision block 606, the process follows the NO path to decision block 610 where a second environmental variable (e.g., the operational voltage) is compared to a predefined criterion. Where the measured voltage matches or satisfies the predefined criterion, the process follows the YES path to function block 608 where the strobe delay configuration/reconfiguration process is performed. If the measured voltage does not satisfy the criterion in block 610, the process follows the NO path and returns to monitoring the environmental variables at function block 604.

Based on the foregoing Detailed Description, it may be appreciated that the embodiments set forth herein provide a self-tuning mechanism that supports dynamic locking of an optimal strobe signal with appropriate phase delay for the sense amps on the bitlines of a memory device. The embodiments also provide for frequent updating of the strobe timing to account for drift in operational temperature and voltage. Further, the embodiments allow for the elimination of fuses required to set the strobe timing, and the wafer test time required to find the strobe timing setting and blow fuses accordingly.

Although the present patent disclosure has been described with reference to certain exemplary embodiments, it is to be understood that the forms of the embodiments shown and described are to be treated as illustrative only. Accordingly, various changes, substitutions and modifications can be realized without departing from the scope of the present disclosure as set forth in the following claims.

What is claimed is:

1. A memory access strobe configuration process, comprising:
    performing an initial strobe configuration to generate a strobe signal having a particular phase, said strobe signal for accessing a memory;
    counting memory operations associated with said memory; and
    performing strobe reconfiguration when the number of memory operations satisfies a predetermined threshold condition, wherein said strobe signal's phase is updated.

2. The memory access strobe configuration process as recited in claim 1, wherein said memory operations comprise read operations.

3. The memory access strobe configuration process as recited in claim 1, wherein said memory operations comprise write operations.

4. The memory access strobe configuration process as recited in claim 1, further comprising adjusting said predetermined threshold condition based on a variation in the processing environment such that said strobe reconfiguration is performed more or less often.

5. The memory access strobe configuration process as recited in claim 4, further comprising adjusting said predetermined threshold condition based on a drift in operational temperature such that said strobe reconfiguration is performed more or less often.

6. The memory access strobe configuration process as recited in claim 4, further comprising adjusting said predetermined threshold condition based on a drift in operational voltage such that said strobe reconfiguration is performed more or less often.

7. A memory access strobe configuration process, comprising:
   performing an initial strobe configuration to generate a strobe signal having a particular phase, said strobe signal for accessing a memory;
   counting read or write operations in said memory; and
   performing strobe reconfiguration when the number of read or write operations satisfies a predetermined threshold condition, wherein said strobe signal's phase is updated.

8. The memory access strobe configuration process as recited in claim 7, wherein said memory operations comprise read operations.

9. The memory access strobe configuration process as recited in claim 7, wherein said memory operations comprise write operations.

10. The memory access strobe configuration process as recited in claim 7, further comprising adjusting said predetermined threshold condition based on a variation in the processing environment such that said strobe reconfiguration is performed more or less often.

11. The memory access strobe configuration process as recited in claim 10, further comprising adjusting said predetermined threshold condition based on a drift in operational temperature such that said strobe reconfiguration is performed more or less often.

12. The memory access strobe configuration process as recited in claim 10, further comprising adjusting said predetermined threshold condition based on a drift in operational voltage such that said strobe reconfiguration is performed more or less often.

13. A memory access circuit, the circuit comprising:
    a memory;
    a strobe configuration circuit to generate a strobe signal having a particular phase, said strobe signal for use in accessing said memory; and
    a counter for counting read or write operations in said memory;
    wherein said strobe configuration circuit reconfigures said strobe signal when the number of read or write operations counted by said counter satisfies a predetermined threshold condition.

14. The circuit of claim 13, wherein said memory operations comprise read operations.

15. The circuit of claim 13, wherein said memory operations comprise write operations.

16. The circuit of claim 13, wherein said predetermined threshold condition is adjusted based on a variation in the processing environment such that said strobe reconfiguration is performed more or less often.

17. The circuit of claim 16, wherein said predetermined threshold condition is adjusted based on a drift in operational temperature such that said strobe reconfiguration is performed more or less often.

18. The circuit of claim 16, wherein said predetermined threshold condition is adjusted based on a drift in operational voltage such that said strobe reconfiguration is performed more or less often.

* * * * *